United States Patent
Wasshuber

(10) Patent No.: US 6,780,742 B1
(45) Date of Patent: Aug. 24, 2004

(54) UNDULATED MOAT FOR REDUCING CONTACT RESISTANCE

(75) Inventor: Christoph Wasshuber, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/613,195

(22) Filed: Jul. 3, 2003

(51) Int. Cl.[7] .......................................... H01L 21/3205
(52) U.S. Cl. ..................... 438/592; 438/197; 438/303; 438/585; 438/595; 438/652; 438/655
(58) Field of Search ................................ 438/592, 197, 438/303, 585, 595, 652, 655

(56) References Cited

U.S. PATENT DOCUMENTS 6,670,670 B2 * 12/2003 Chae et al. .................. 257/316

* cited by examiner

*Primary Examiner*—Jack Chen
(74) *Attorney, Agent, or Firm*—Jacqueline J. Garner; W. James Brady, III; Frederick J. Telecky, Jr.

(57) ABSTRACT

The present invention includes a method of forming a semiconductor device.

8 Claims, 8 Drawing Sheets

US 6,780,742 B1

UNDULATED MOAT FOR REDUCING CONTACT RESISTANCE

TECHNICAL FIELD OF THE INVENTION

This invention relates generally to the field of electronic devices and more particularly to a semiconductor device having reduced contact resistance.

BACKGROUND OF THE INVENTION

Without limiting the scope of the invention, its background is described in connection with semiconductor manufacturing and is best exemplified by methods and processes for fabricating semiconductor devices.

Consumers of computers and other electronic devices that are operated by semiconductor chips typically desire products that process information faster than previous devices. One limiting factor of semiconductor chip process speed is how quickly electric current travels through a particular semiconductor device. Current travels more slowly through a device that has high electrical resistance in comparison to current speed through a device that has a lower resistance. Therefore, if regions of high electrical resistance in a device are reduced, the device will become faster.

One area of high resistance in a semiconductor device is a contact. Contacts are usually metallic or semi-metallic pads that electrically connect internal semiconductor components to external power sources. Much effort has been directed toward reducing the contact resistance of semiconductor devices. Most of this effort, however, has been spent developing new alloys for contacts that inherently have less electrical resistance than conventional materials that are currently used to fabricate contacts. Using new alloys for contacts detrimentally increases costs because additional materials, some of which are exotic and expensive, add to the total cost of the device and can increase the comnplexity of the fabrication process.

Semiconductor device fabrication often utilizes a salicide process. A salicide process is a self-aligned silicidation process. In a silicidation process, a metal, such as titanium, is placed into contact with silicon and heated. Heating of the titanium and silicon causes the silicon and titanium to combine to form a silicide compound. Silicidation is conventionally used to provide a conductive contact between silicon in a semiconductor device and a metal contact, which may be connected to a conductive lead. The resulting silicon-silicide-metal combination provides less contact resistance than provided with a direct metal-to-silicon contact. Large contact resistance is generally detrimental to the performance of a semiconductor device. A silicidation process is self-aligned, or a salicide process, when masking is not required to deposit the metal used to form the silicide compound.

A problem with the use of titanium in a silicide compound is that titanium silicide suffers from size effects. As the volume of a titanium silicide region in a semiconductor device decreases, its contact resistance increases. Thus, as semiconductor devices shrink, particularly the length of a gate in a semiconductor device, the use of titanium silicide may become unacceptable due to resulting high contact resistances. Because of the susceptibility to size effects of titanium silicide, cobalt and nickel are sometimes used as alternatives. In contrast to titanium silicide, cobalt silicide and nickel silicide do not suffer size effects and have a relatively constant resistance for varying volumes of the resulting silicide compound.

Although the use of cobalt or nickel in a silicidation process offers benefits over the use of titanium, their use is not without disadvantages. For example, the use of cobalt or nickel can result in current leakage into the silicon substrate. Such current leakage can be detrimental. In addition, the use of cobalt or nickel, although providing relatively constant contact resistance for varying volumes of silicide, has resulted in greater than expected contact resistances.

What is needed is a contact having reduced contact resistance that does not require specialized materials. Additionally, a method for fabricating a contact having reduced contact resistance is needed that does not add specialized materials or costly steps to the fabrication process.

SUMMARY OF THE INVENTION

Accordingly, a need has arisen for a semiconductor device having reduced contact resistance. The present invention

BRIEF DESCRIPTION OF THE FIGURES

For a more complete understanding of the present invention, including its features and advantages, reference is now made to the detailed description of the invention taken in conjunction with the accompanying drawings in which like numerals identify like parts and in which.

DETAILED DESCRIPTION OF INVENTION

Embodiments of the present invention and its advantages are best understood by referring to FIGS. 1 through 8 of the drawings, like numerals being used for like and corresponding parts of the various drawings.

Figure 1:
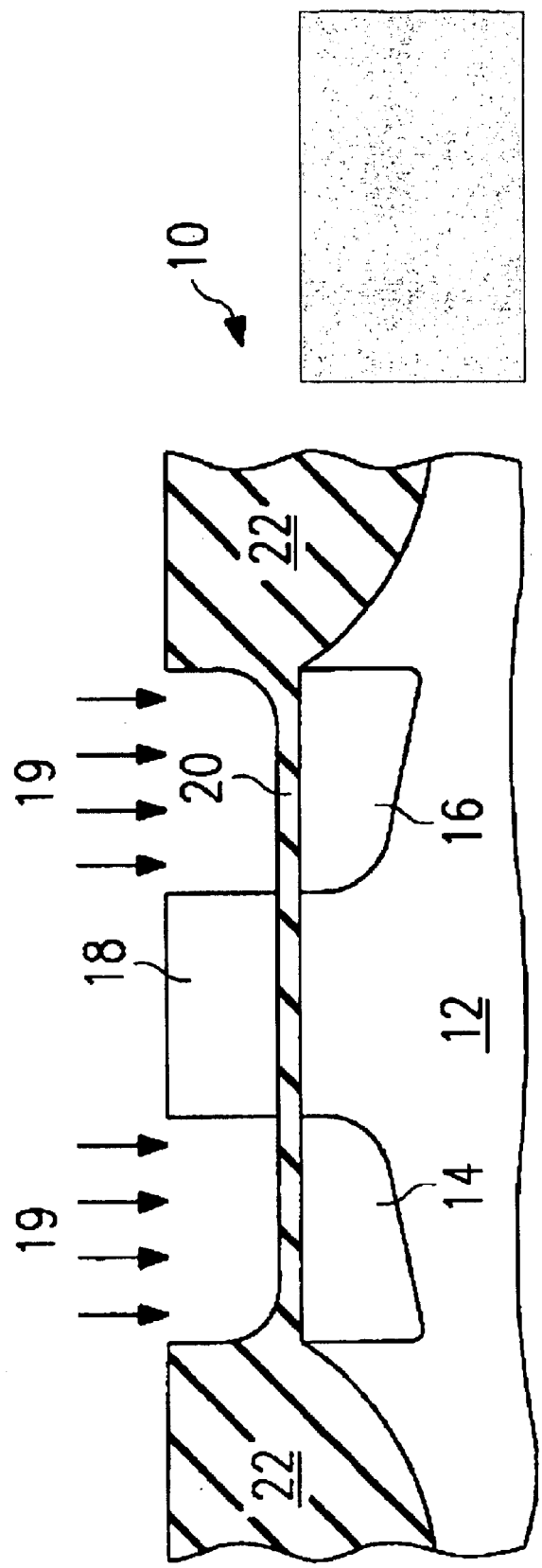
FIGS. 1 through 7 are simplified cross-sectional views of a semiconductor structure in various states of fabrication according to one embodiment of the invention.

FIG. 1 illustrates a semiconductor device 10 during an initial state of construction after formation of a source region 14 and a drain region 16 in a substrate 12 and after formation of a gate body 18 overlying an oxide layer 20. Also illustrated in FIG. 1 are thick field oxide regions 22 utilized to isolate the resulting transistor from adjacent semiconductor devices. Source region 14, drain region 16, gate body 18, oxide layer 20, and field oxide regions 22 may be formed according to conventional techniques.

One example of a conventional technique for forming the semiconductor device 10 illustrated in FIG. 1 is described below. In this example, substrate 12 is a P-type silicon substrate; however, substrate 12 could be an N-type substrate. Thick field oxide regions 22 are formed by local oxidation of silicon using a process such as that shown in Havemann, et al. U.S. Pat. No. 4,541,167, issued Sep. 17, 1985 and assigned to the assignee of this application. Substrate 12 is then subjected to a thermal oxidation in a steam environment for approximately 7 minutes at a temperature of approximately 850 degrees C. to form oxide layer 20 as shown in FIG. 1. Oxide layer 20 may be grown to a thickness of approximately 3 to 10 nanometers, however, other thicknesses for oxide layer 20 may be used. A polysilicon layer is then deposited, patterned and etched using conventional photolithographic techniques to form polysilicon gate body 18. An example thickness of polysilicon gate body is approximately 400 nanometers. Appropriate ions 19 are then implanted, self-aligned to form source region 14 and drain region 16. For a P-type substrate, appropriate ions include phosphorous ions and arsenic ions. An example implantation includes implantation of arsenic ions at a density of approximately 3 times 10 sup 5 ions per square centimeter and an energy of approximately 150 kiloelectron volts. A second ion implantation of phosphorous ions having a density of approximately 4 times 10 sup 14 ions per square centimeter and an energy level of approximately 85 kiloelectron volts may also be incorporated.

A channel region is defined within substrate 12 between source region 14 and drain region 16. Although particular details of one example of the formation of source region 12, drain region 14, gate body 18, oxide layer 20, and field oxide regions 22 have been provided, other methods and techniques may be utilized without departing from the scope of the present invention.

Figure 2:
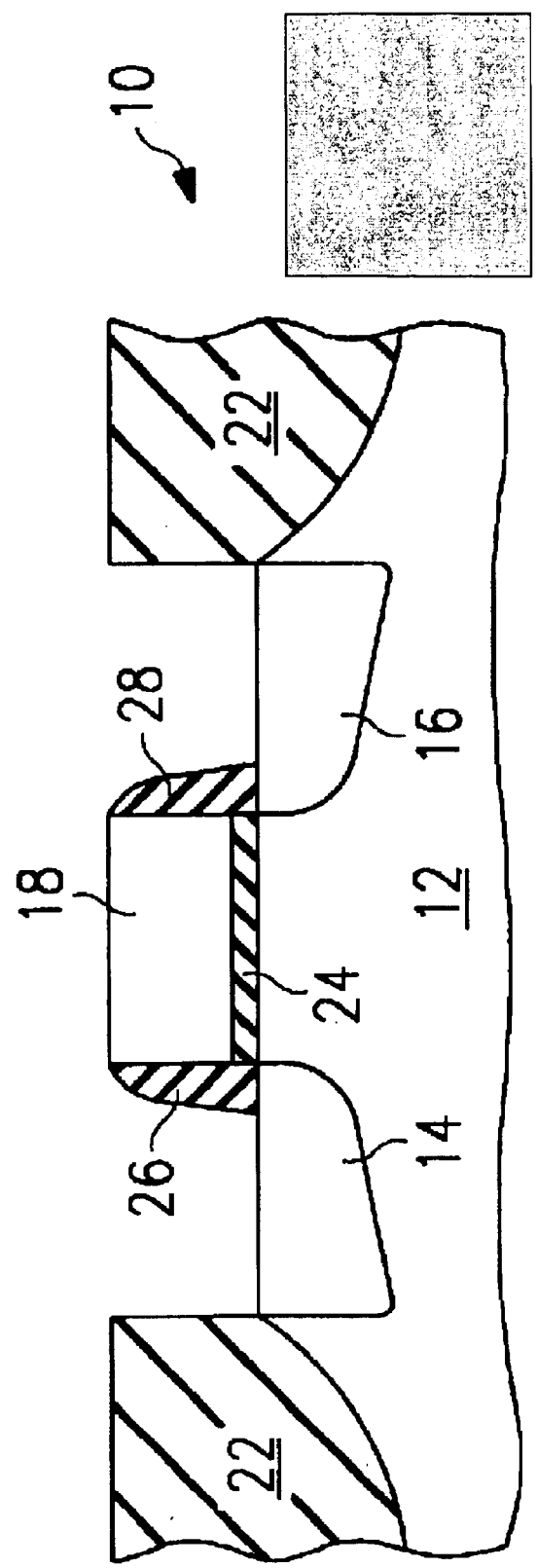

FIG. 2 illustrates semiconductor device 10 after formation of a gate oxide layer 24 and sidewall spacers 26 and 28. Gate oxide layer 24 is formed by patterning and etching oxide layer 20 using conventional photolithographic techniques. Sidewall spacers 26 and 28 provide separation between a silicide that will be formed over source and drain regions 14, 16 and gate body 18, which is conductive. Sidewall spacers 26 and 28 may be formed, for example, by depositing a conformal layer of TEOS oxide over semiconductor device 10 and anisotropically etching the TEOS oxide layer, leaving sidewall spacers 26 and 28. Sidewall spacers 26 and 28 may alternatively be formed prior to implantation of ions 19 to form source region 14 and drain region 16.

Figure 3:
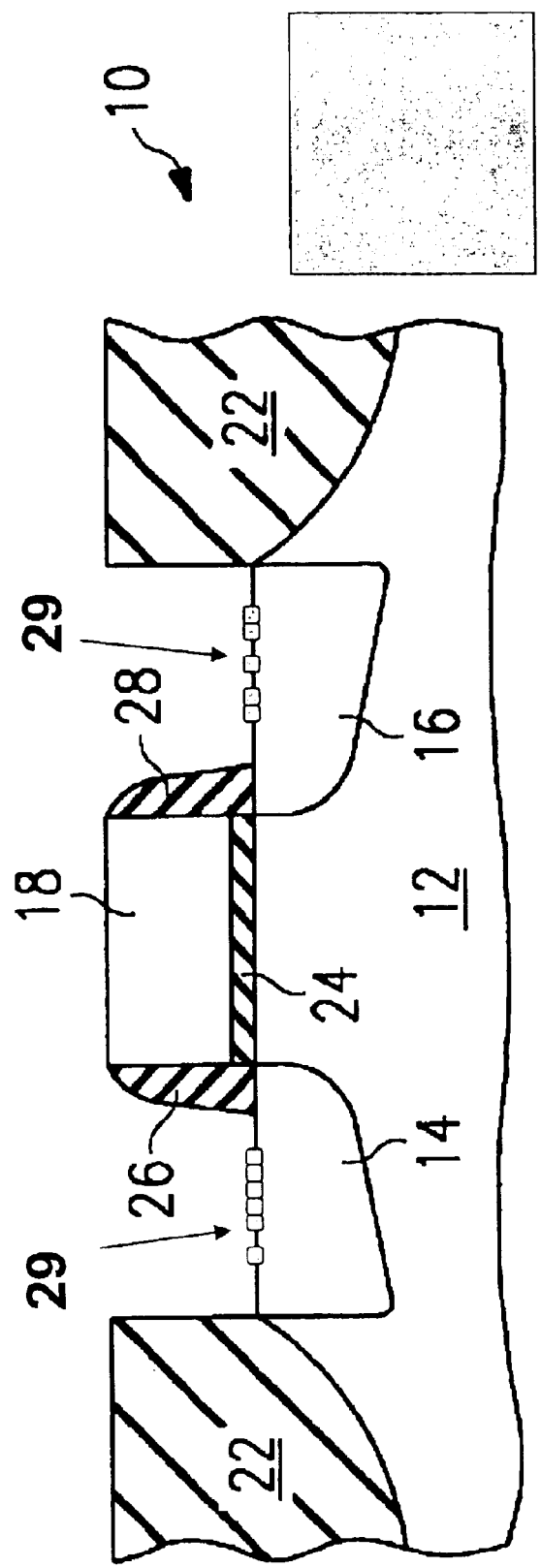

FIG. 3 illustrates semiconductor device 10 after formation of a Germanium (Ge) quantum dots 29 on the source region 14 and the drain region 16. the quantum dots 29 can be grown directly on the source region 14 and the drain region 16. The Ge quantum dots will help undulate the moat and area. The larger area will produce less resistance and thus be more efficient.

Figure 4:
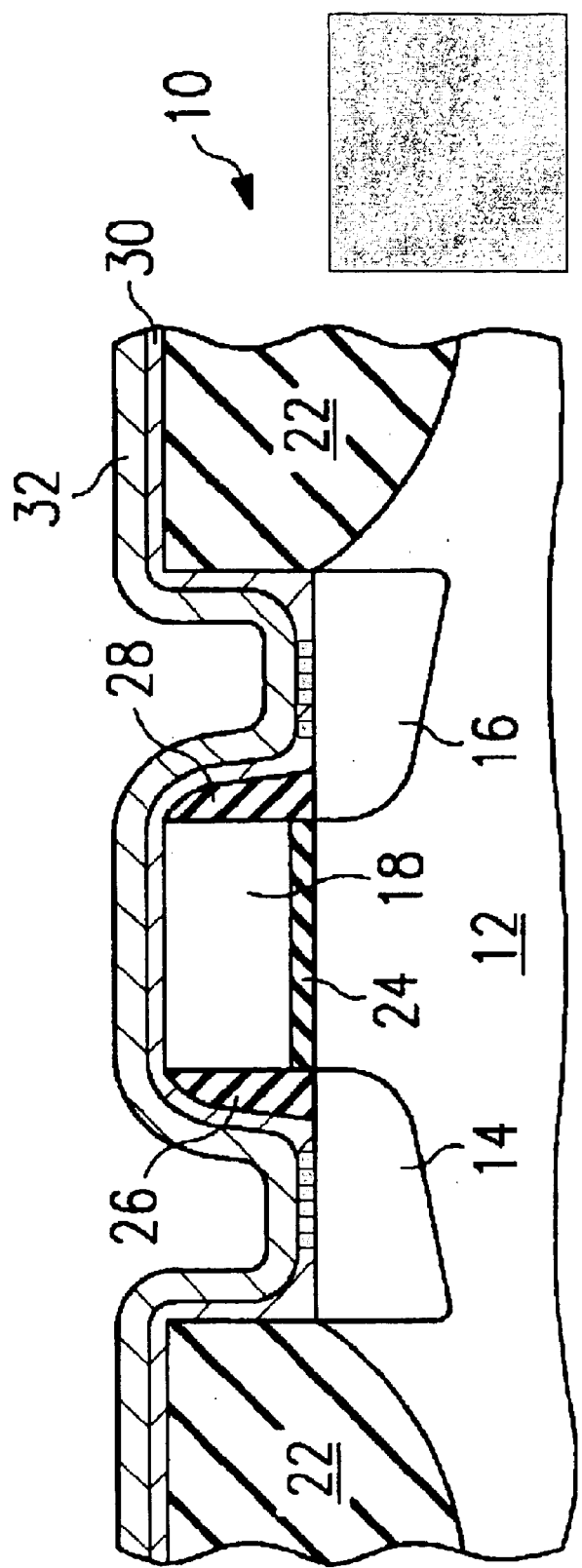

FIG. 4 illustrates the deposition of a thin buffer layer 30 of metal. Thin buffer layer 30 will act as a buffer layer between silicon in source region 12, drain region 14, and gate body 18 and a metal layer during formation of silicide regions in semiconductor device 10. As described in greater detail below, zirconium and hafnium are both particularly suitable metals for thin buffer layer 30; however, other suitable metals may be used without departing from the teachings of the present invention. Thin buffer layer 30 is deposited outwardly from semiconductor device 10 to a thickness of approximately 1 to 5 nanometers. Thin buffer layer 30 resists spiking during the formation of a silicide and also contributes to low contact resistance between a resulting silicide and a metal contact. Although particular thicknesses for thin buffer layer 30 have been described, other thicknesses for thin buffer layer 30 may be utilized. However, thin buffer layer 30 should be sufficiently thin to prevent the formation of a second silicide layer in addition to a silicide layer formed primarily from a metal layer 32.

Metal layer 32 is illustrated disposed outwardly over thin buffer layer 30. Metal layer 32 is provided for reaction with silicon in source region 14, drain region 16, and gate body 18 to produce silicide regions for establishing an electrical connection with metal contacts. Such silicide regions provide lower contact resistance between a metal contact and the silicon in source region 14, drain region 16, or gate body 18 than would occur with a direct contact between a metal contact and the silicon in source region 14, drain region 16, or gate body 18. Metal layer 32 may be formed from any suitable metal that is a different metal from that used for thin buffer layer 30; however, cobalt and nickel are both particularly advantageous metals for use in metal layer 32. Both cobalt silicide and nickel silicide do not suffer size effects traditionally associated with the use of titanium to form a silicide compound. Therefore, the use of such materials allows for reduced contact resistances, which are particularly important as the size of semiconductor devices decrease. Metal layer 32 is deposited to a thickness in the range of 5 nanometers to 40 nanometers; however, other thicknesses for layer 32 may be used without departing from the scope of the present invention.

Figure 5:
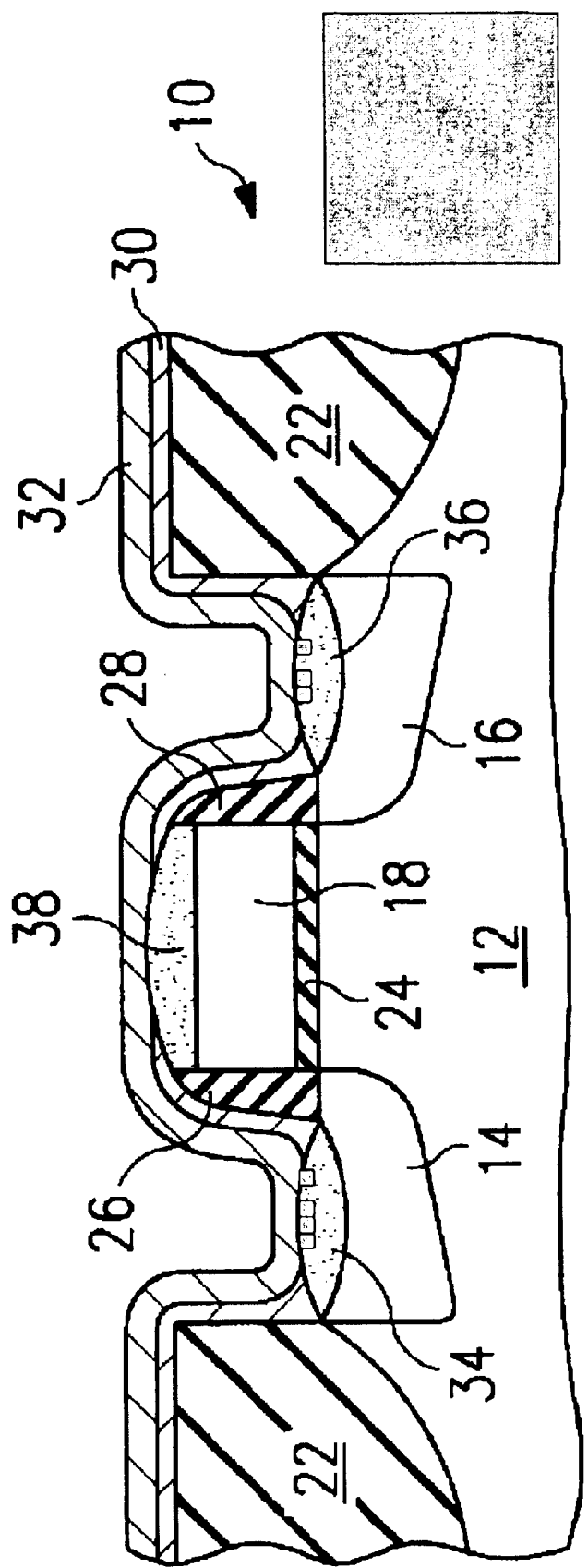

FIG. 5 illustrates semiconductor device 10 after reaction of metal layer 32 with thin buffer layer 30 and the silicon in source region 14, drain region 16, and gate body 18. Due to the reaction of these materials, a silicide region 34 is formed overlying source region 14, and a silicide region 36 is formed overlying drain region 16. In addition, a silicide region 38 is formed overlying gate body 18. Silicide regions 34, 36, and 38 are formed by heating of semiconductor device 10 such that the metal in metal layer 32 may react with the silicon in source region 14, drain region 16, and gate body 18, as well as the metal in thin buffer layer 30 to form a silicide. Note the quantum dots 29 also form more area on the silicide regions 34, 26.

According to one embodiment, such an anneal occurs at a temperature in the range of 450.degree. C. to 850.degree. C. for a time period of 10 seconds to 100 seconds. In addition to this anneal, a second anneal could be performed with similar temperature and time conditions to cause further reaction of the materials.

Because different metals are used within metal layer 32 and thin buffer layer 30, a silicide compound is formed within silicide regions 34, 36, and 38 incorporating each metal. With thin buffer layer 30 being thinner than metal layer 32, the metal in metal layer 32 will form a majority silicide within silicide regions 34, 36, and 38 and the metal within thin buffer layer 30 will form a minority silicide within silicide regions 34, 36, and 38. An example of the resulting compound in silicide regions 34, 36, and 38 formed according to the teachings of the present invention is CoZr.sub.y Si.sub.x, where "x" represents the ratio of silicon atoms to cobalt atoms and "y" is less than one and represents the ratio of zirconium atoms to cobalt atoms. Other examples of compounds comprising silicide regions 34, 36, and 38 include CoHf.sub.y Si.sub.x, NiZr.sub.y Si.sub.x, and NiHfsub.y Si.sub.x, where "x" represents the ratio of silicon atoms to either cobalt or nickel atoms and "y" is less than one and represents the ratio of either the number of hafnium atoms or zirconium atoms to the number of cobalt or nickel atoms.

Figure 6:
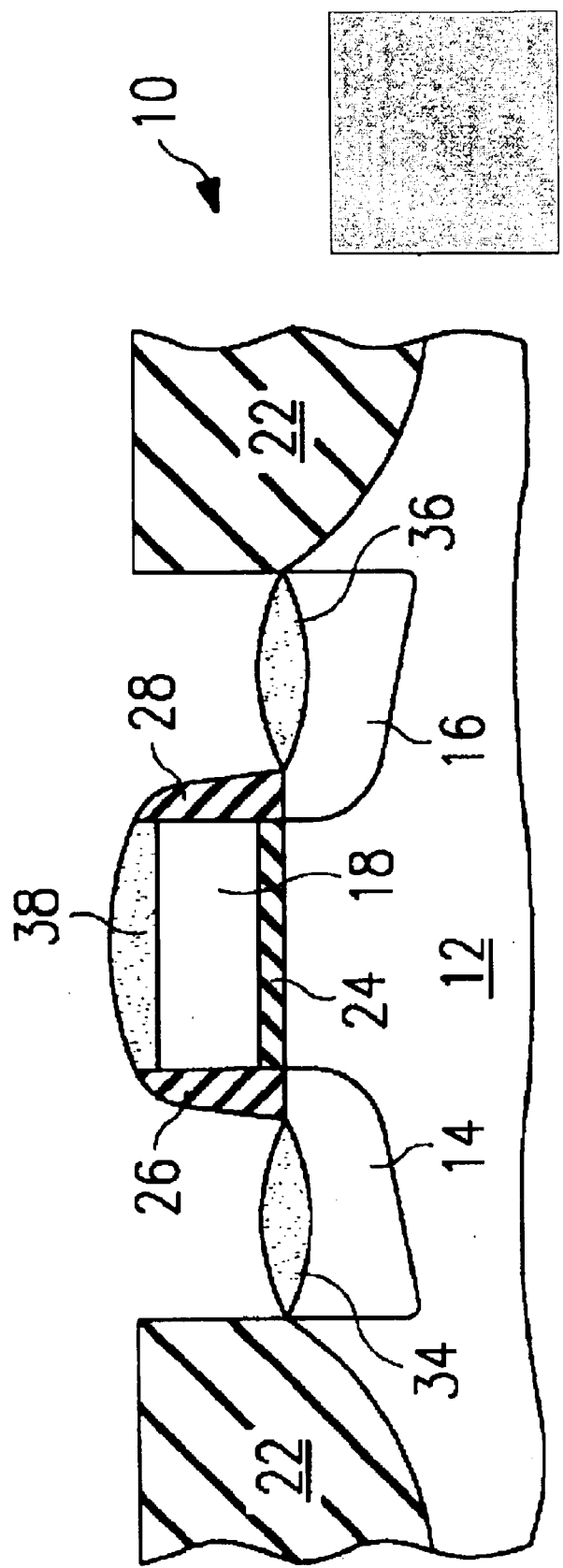

FIG. 6 illustrates semiconductor device 10 after additional processing steps associated with removing thin buffer layer 30 and metal layer 32. After formation of silicide regions 34, 36, and 38, the unreacted metals in metal layer 32 and thin buffer layer 30 may be selectively removed through the use of an etchant that does not attack the silicide in silicide regions 34, 36, and 38, silicon substrate 12, or field oxide regions 22. An example of such an etchant is a mixture of H.sub.2 O.sub.2 and H.sub.2 SO.sub.4.

Figure 7:
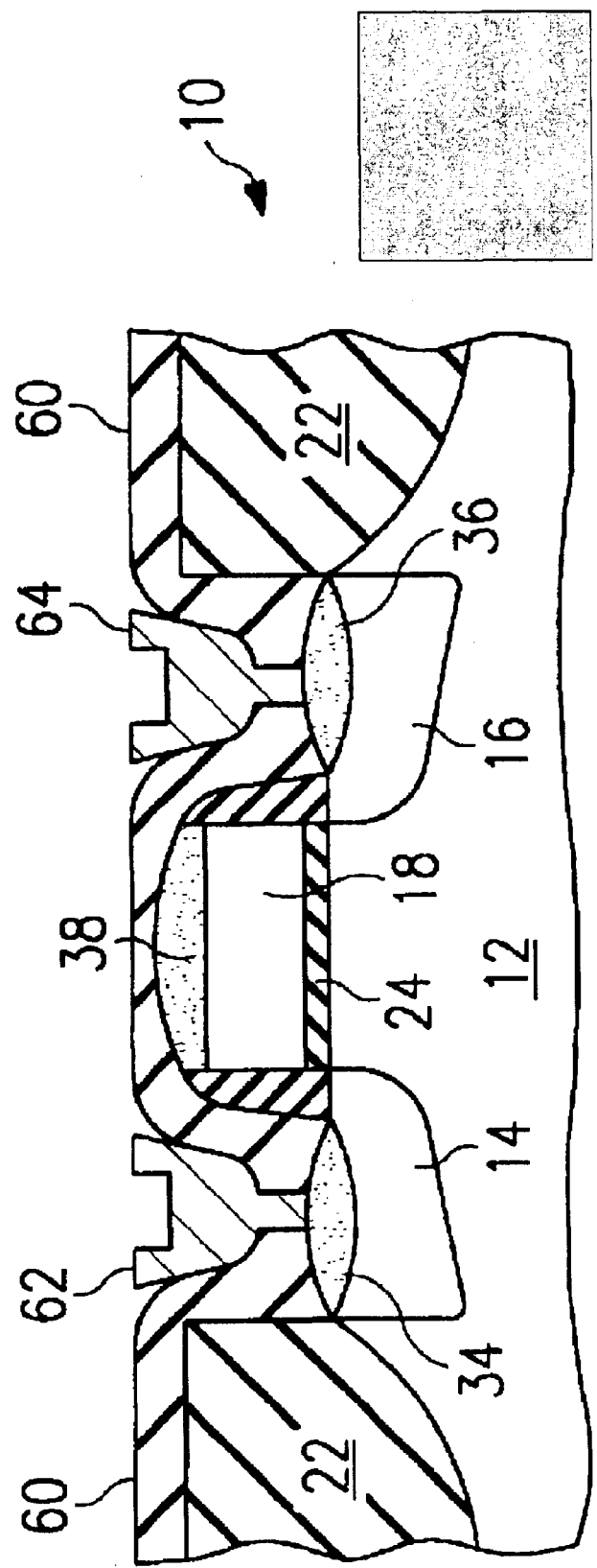

FIG. 7 illustrates semiconductor device 10 after formation of metal contacts 62 and 64. After etching of metal layer 32 and thin buffer layer 30, a dielectric layer 60 is deposited. Contact holes are then opened to expose portions of silicide regions 34 and 36 overlying source region 14 and drain region 16, respectively. An example method for exposing portions of silicide regions 34 and 36 is photolithographic masking and etching. After exposing portions of silicide regions 34 and 36, metal is deposited into the contact holes to form metal contacts 62 and 64. Metal contacts 62 and 64 therefore provide a conductive path to source region 14 and drain region 16. A metal contact may also be formed for connection to silicide region 38.

The use of a thin buffer layer 30 provides several benefits. First, if zirconium or hafnium is used, because zirconium oxide and hafnium oxide both have high heats of formation, zirconium and hafnium are good oxide reduction materials. For example, zirconium oxide has a heat of formation of approximately −360 kJ/mole and hafnium oxide has a heat of formation of approximately −380 kJ/mole. By comparison, silicon dioxide has a heat of formation of approximately −300 kJ/mole. Because zirconium and hafnium are good oxide reduction materials, native oxide formed on the surface of the resulting silicide in silicide regions 34, 36, and 38 is reduced. Reduction of native oxide on the surface silicide regions 34, 36, and 38 eliminates the problem of higher than expected contact resistance due to native oxide formation.

Figure 8:
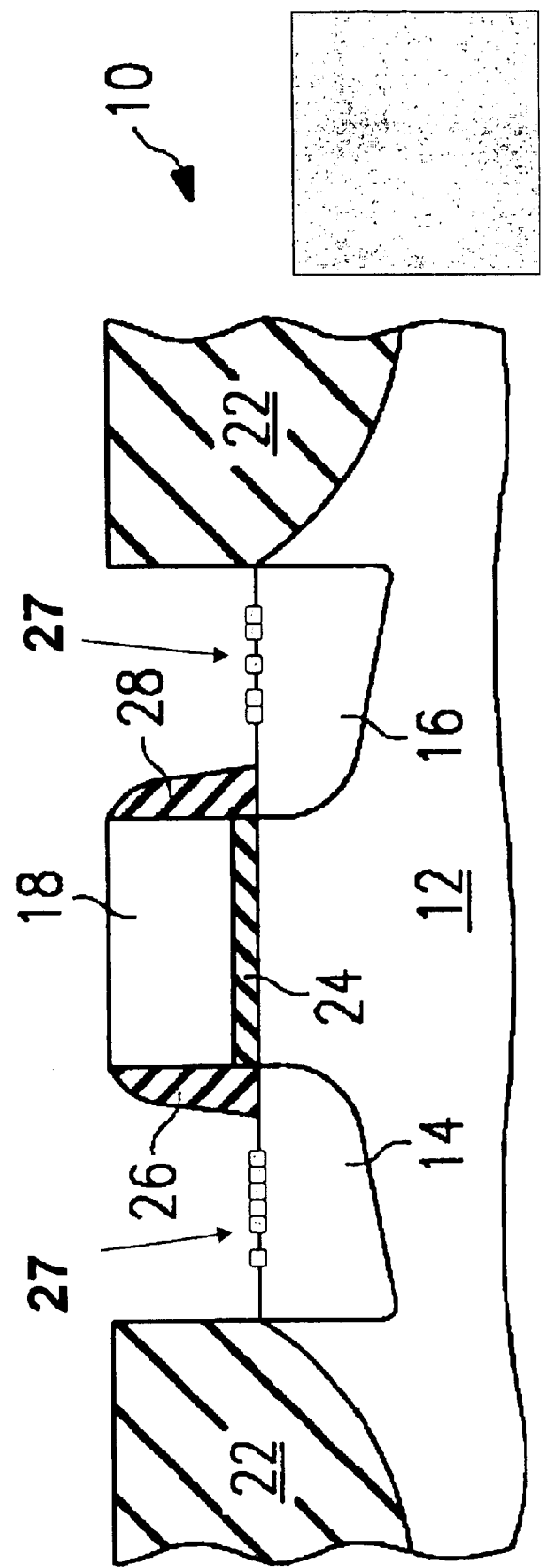
FIG. 8 is a simplified cross-sectional view of a second embodiment of the invention.

FIG. 8 illustrates another method of undulating the moat surface. In this embodiment, photo resist is sprayed in small drops on the moat area and then a short etch is performed to roughen the moat area. This roughened moat area also increases the area and thus reduces resistance in the final product.

Although this invention has been described with reference to an illustrative embodiment, this description is not intended to limit the scope of the invention. Various modifications and combinations of the illustrative embodiments as well as other embodiments of the invention will be apparent to persons skilled in the art upon reference to the description. It is therefore intended that the appended claims accomplish any such modifications or embodiments.

What is claimed is:

1. A method of forming a semiconductor device in the surface of a substrate, the method comprising the steps of:

separating a semiconductor gate body from the outer surface of the substrate by a gate insulator layer;

forming a conductive drain region in the outer surface of the substrate and spaced apart from the gate body;

forming a conductive source region in the outer surface of the substrate and spaced apart from the gate body opposite the conductive drain region to define a channel region in the substrate disposed inwardly from the gate body and the gate insulator layer;

forming quantum dots on the source region and the drain region;

depositing a metal buffer layer over the conductive source region and conductive drain region;

depositing a metal layer over the metal buffer layer; and reacting the metal layer and metal buffer layer with the conductive source region and conductive drain region to form respective first and second silicide regions.

2. The method of claim 1, wherein the step of depositing a metal layer over the metal buffer layer includes depositing a metal layer selected from the group consisting of cobalt and nickel.

3. The method of claim 1, wherein the step of reacting the metal layer and metal buffer layer with the conductive source region and conductive drain region includes annealing the metal layer, metal buffer layer, conductive source region, and conductive drain region.

4. The method of claim 3, wherein the step of annealing includes annealing at a temperature in the range of 450 degrees Centigrade to 850 degrees Centigrade for a time period in the range of 10 seconds to 100 seconds.

5. The method of claim 1, wherein the step of depositing a metal buffer layer further includes depositing a metal buffer layer having a thickness in the range of 1 to 5 nanometers.

6. The method of claim 1, wherein the step of depositing a metal buffer layer over the conductive source region and conductive drain region further includes depositing the metal buffer layer over the gate body and farther comprising reacting the metal layer and metal buffer layer with the gate body.

7. The method of claim 1, wherein the step of depositing a meal layer over the metal buffer layer includes depositing a metal layer consisting essentially of cobalt.

8. The method of claim 1, wherein the step of depositing a metal layer over the metal buffer layer includes depositing a metal layer consisting essentially of nickel.

* * * * *